United States Patent
Baur et al.

[11] Patent Number: 6,163,460
[45] Date of Patent: Dec. 19, 2000

[54] HOUSING FOR ELECTRONIC ASSEMBLIES INCLUDING BOARD-MOUNTED COMPONENTS AND SEPARATE DISCRETE COMPONENTS

[75] Inventors: Richard Baur, Pfaffenhofen; Guenter Fendt, Schrobenhausen; Engelbert Woerle, Kuehbach; Juergen Ryll, Egelsbach, all of Germany

[73] Assignee: Temic Telefunken microelectronic GmbH, Heilbrohn, Germany

[21] Appl. No.: 09/169,268

[22] Filed: Oct. 9, 1998

[30] Foreign Application Priority Data

| Oct. 11, 1997 | [DE] | Germany | 197 45 014 |
| Apr. 7, 1998 | [DE] | Germany | 198 15 490 |

[51] Int. Cl.⁷ ........................................ H05K 5/00
[52] U.S. Cl. .................. 361/752; 361/753; 361/773; 361/774; 361/782; 361/785; 361/807; 361/811; 439/391; 439/395; 439/397
[58] Field of Search .................... 361/752, 753, 361/768, 773, 774, 779, 782, 785–789, 796; 439/391, 395, 397, 76.1

[56] References Cited

U.S. PATENT DOCUMENTS

| 3,029,057 | 4/1962 | Ferm . | |
| 4,198,645 | 4/1980 | Nishizawa | 357/22 |
| 4,396,245 | 8/1983 | Lane | 439/148 |
| 4,841,414 | 6/1989 | Hibino et al. | 361/818 |
| 4,969,829 | 11/1990 | Sato | 439/83 |
| 5,091,826 | 2/1992 | Arnett et al. | 361/776 |
| 5,249,977 | 10/1993 | Tanaka et al. | 439/135 |
| 5,688,133 | 11/1997 | Ikesugi et al. | 439/135 |

FOREIGN PATENT DOCUMENTS

| 0 022 483 A1 | 1/1981 | European Pat. Off. . |
| 0 141 538 A1 | 5/1985 | European Pat. Off. . |
| 0 190 508 A2 | 8/1986 | European Pat. Off. . |
| 0 663 698 A1 | 7/1995 | European Pat. Off. . |
| 0 687 015 A2 | 12/1995 | European Pat. Off. . |
| 2250259 | 5/1975 | France . |
| 57-9226 | 2/1982 | Japan . |
| 57-9226 B2 | 2/1982 | Japan . |
| 57-88771 | 6/1982 | Japan . |
| 59-17547 | 4/1984 | Japan . |
| 59-17547 B2 | 4/1984 | Japan . |
| 59-143363 | 8/1984 | Japan . |
| 60-5064 | 2/1985 | Japan . |
| 60-5064 B2 | 2/1985 | Japan . |
| 911445 | 11/1959 | United Kingdom . |

OTHER PUBLICATIONS

Patent Abstract of Japan; Publication No. 62 62558 A; Date Mar. 19, 1987; Ogura Tsuneo et al.
Abstract of Japanese Patent Laid–Open Publication No. 57–83057.
Abstract of Japanese Patent Laid–Open Publication No. 53–16569.
Patent Abstract of Japan; Publication No. 62 62558 A: Date: Mar. 19, 1987; Ogura Tsuneo et al.

*Primary Examiner*—Jeffrey Gaffin
*Assistant Examiner*—Tuan Dinh
*Attorney, Agent, or Firm*—W. F. Fasse; W. G. Fasse

[57] ABSTRACT

An arrangement of electronic components in a housing includes a housing, at least one circuit board arranged in the housing with electronic components of a first type (such as SMDs) mounted thereon, at least one electronic component of a second type (such as a non-SMD coil or capacitor) that is not arranged on the circuit board but rather is mounted on a mounting surface in the housing, and an electrical connection established between the second electronic component and the circuit board. The electrical connection may be established by a connector member having two connecting shanks connected to the wires of the second component and two mounting shanks that are press-fit into contact holes of the circuit board. Alternatively, the electrical connection may be established by respective contact clips electrically and mechanically clamped onto the wires of the second component, whereby the contact clips have contact pins that plug into contact holes in the circuit board.

23 Claims, 5 Drawing Sheets

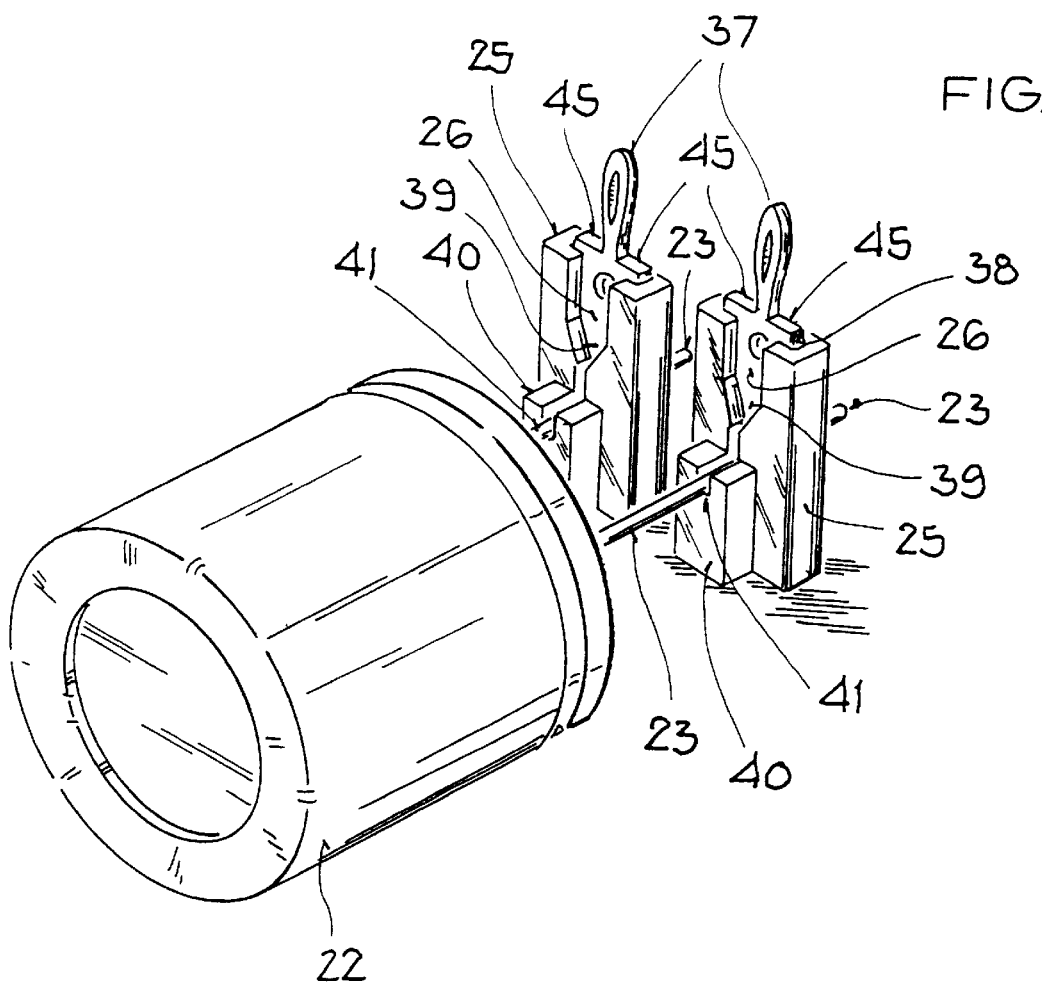

HOUSING FOR ELECTRONIC ASSEMBLIES INCLUDING BOARD-MOUNTED COMPONENTS AND SEPARATE DISCRETE COMPONENTS

PRIORITY CLAIM

This application is based on and claims the priority under 35 U.S.C. §119 of German Patent Applications 197 45 014.8, filed on Oct. 11, 1997 and 198 15 490.9, filed on Apr. 7, 1998, the entire disclosures of which are incorporated herein by reference.

FIELD OF THE INVENTION

The invention relates to an arrangement and particularly a housing and an electrical connector for assembling electronic components mounted on at least one circuit board as well as other discrete components not mounted on the circuit board.

BACKGROUND INFORMATION

In conventional arrangements of circuit boards in a housing, several problems often arise. First of all, in the context of a hybrid or mixed assembly of surface mount devices (SMDs) as well as wire-bonded or wired components arranged on a circuit board, the circuit board and thus also the housing must be dimensioned excessively large in order to accommodate the relatively large wired components. Secondly, difficulties arise because the same soldering process is not suitable for soldering the two different types of components onto the same side of the same circuit board. Namely, a reflow soldering process that is suitable for soldering the surface mount devices cannot be used for soldering the wired devices onto the board.

It has been attempted in the art to solve the soldering problems affecting mixed or hybrid assemblies including different types of components to be mounted on a circuit board, in that an adapter made of plastic is inserted between each respective wired component and the circuit board, and the connectors of the component are bent over so that they extend substantially parallel to the surface of the circuit board. However, such a process and arrangement involves increased costs due to the use of the adapter and additional mounting steps necessitated thereby. As a further disadvantage, the soldered connections become more sensitive to vibrations and the like, which arise if the finished electronic assembly incorporating the circuit board is to be mounted in a motor vehicle, for example.

Furthermore, some electronic components such as electrolyte capacitors cannot be soldered onto a circuit board by the reflow soldering process, despite the use of an adapter as described above, because the high temperatures arising during the soldering process can disrupt or destroy the electrolyte capacitor due to the gas pressure arising internally within the capacitor at such elevated temperatures. A further inescapable problem in arranging wired components on a circuit board is that these components thereby use up a relatively large surface area of the expensive "real estate" of the circuit board surface, and correspondingly require a large-sized housing.

SUMMARY OF THE INVENTION

In view of the above it is an object of the invention to provide an arrangement of an electronic assembly by which the mixed mounting of surface mount devices as well as separate discrete components directly onto a circuit board is avoided, so that the size of the circuit board and the size of the housing for the assembly can be reduced. The invention further aims to avoid or overcome the disadvantages of the prior art, and to achieve additional advantages, as apparent from the present description.

The above objects have been achieved in an arrangement or assembly of electronic components according to the invention, including a housing, a circuit board arranged in the housing, at least one first electronic component mounted on the circuit board, at least one second component arranged on a mounting surface of the housing preferably located across from the circuit board, and an electrical connection between the second component and the circuit board. The above objects have further been achieved in a method for assembling the above mentioned arrangement.

The invention achieves at least the following advantages. Despite the overall mixed or hybrid arrangement of surface mount devices as well as wired electronic components being connected to a circuit board, it is possible to avoid the use of the complicated flow or wave soldering process that is typically subject to quality control problems. In this context, the second, wired electronic components are components that cannot typically be manufactured as surface mount devices, such as capacitors, coils, or reed contact elements, for example, and instead are discrete devices having electrical connection wires or leads protruding therefrom. Moreover, the inventive connection between the second electronic component and the circuit board simultaneously establishes a mechanical securing or fixing as well as an electrical contact, without requiring the wires or leads of the component to be mechanically bent. Furthermore, the mounting and electrical contacting or bonding of the wired components can be carried out either before or after the soldering process that is used for bonding the surface mount devices on the circuit board, so that the assembly process and soldering process for the circuit board remains very flexible.

A first particular embodiment of the invention relates to a first electrical connection comprising a contact clip that is connected to the mounting surface of the housing by suitable holding means and that includes a contact pin connected to the circuit board. In this context, the contact pin is advantageously embodied as a press-in pin having a springy insertion fit into a corresponding contact hole provided in the circuit board. The contact clip further forms a cutting and clamping contact or connection with the connecting wires or leads of the component, namely a connection that cuts into and clampingly holds the connecting wires of the component. Such a cutting and clamping contact is also known as an insulation piercing contact, but it should be understood that the leads of the component may or may not be provided with an insulation. A second embodiment of an electrical connection according to the invention comprises a first electrically conducting angled element including a first mounting shank and a first connecting shank, as well as a second electrically conducting angled element including a second mounting shank and a second connecting shank. The two angled elements are at least initially, temporarily and separatably held together in the area of the base legs of the shanks by means of a frangible link member. In order to establish the electrical contact, the first and second angled connecting shanks are respectively connected to the connecting wires of the electronic component. On the other hand, for establishing the mechanical and electrical connection with the circuit board, free ends of the first and second angled mounting shanks are respectively embodied as press-in contact pins that are pressed into receiving holes provided in the circuit board.

BRIEF DESCRIPTION OF THE DRAWINGS

In order that the invention may be clearly understood, it will now be described in connection with example embodiments, with reference to the accompanying drawings, wherein:

FIG. 3D is a schematic perspective view of the components of FIG. 3C in the assembled condition.

DETAILED DESCRIPTION OF PREFERRED EXAMPLE EMBODIMENTS AND OF THE BEST MODE OF THE INVENTION

Figure 1A:
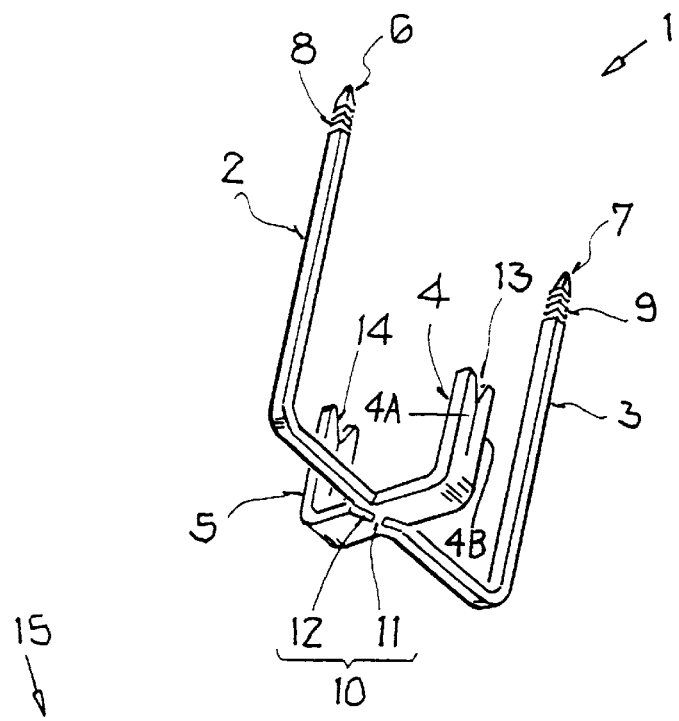
FIG. 1A is a schematic perspective view of a first embodiment of a connector member according to the invention.

In the first embodiment shown in FIG. 1A, the inventive connector member 1 is preferably a unitary or one-piece member made of sheet metal, for example a stamp-cut member of a copper beryllium alloy or some other alloy having similar mechanical and electrical properties (e.g. a mechanical strength and elongation as well as an electrical resistivity within ±5% of those properties of a copper beryllium alloy). The connector member 1 comprises a first electrically conducting angled element including a first mounting shank 2 and a first connecting shank 4, as well as a second electrically conducting angled element including a second mounting shank 3 and a second connecting shank 5. In this context, a respective angled leg of each of the mounting shanks 2 and 3 and of each of the connecting shanks 4 and 5 is bent preferably at 90° relative to a respective base leg of the shank, whereby all of the angled legs are preferably bent in the same direction. The respective free ends of the angled legs of the mounting shanks 2 and 3 are embodied as press-in contact pins, namely the free ends comprise pyramid-shaped tips 6 and 7 as well as a knurling or ribbing 8 and 9. Preferably the two mounting shanks 2 and 3 each have the same length respectively, and the two connecting shanks 4 and 5 each have the same length respectively.

The lengthwise axes of the two base legs of the mounting shanks 2 or 3 and the lengthwise axes of the two base legs of the connecting shanks 4 and 5 preferably intersect each other at a common intersection point, which is preferably a right angle intersection. At the area of this intersection, the connector member 1 comprises a separating element 10 in the form of a notch or cut 12 that is interrupted by a web or frangible link 11. Namely, the respective base legs of the opposite connecting shanks 4 and 5 and of the opposite mounting shanks 2 and 3 are temporarily and separatably connected to each other by the web or frangible link 11, which can be cut or separated after installation as will be described below.

Figure 1B:
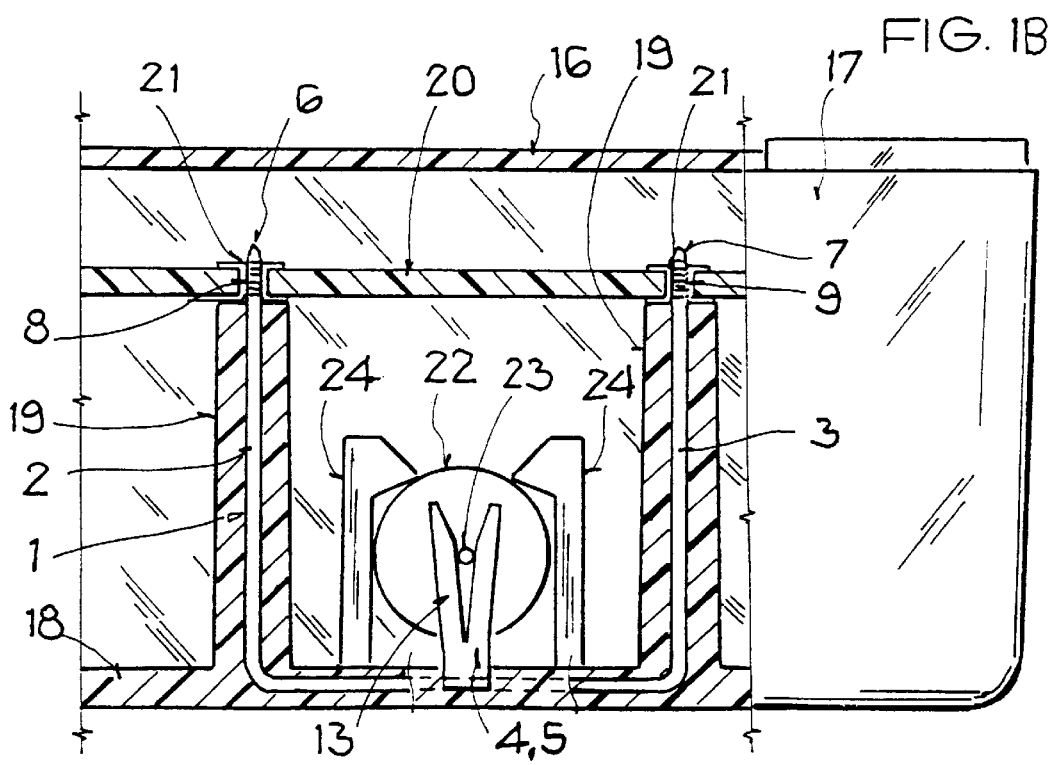
FIG. 1B is a schematical sectional view of the connector member according to FIG. 1A arranged as an inlaid or inserted component integrated into a plastic housing.

The free ends of the connecting shanks 4 and 5 respectively comprise Y-shaped slotted notches 13 and 14, which will respectively clampingly receive a connecting wire 23 of a wired electronic component 22 in the assembled condition as shown in FIG. 1B. In order to ensure that a cutting or piercing and clamping contact is formed between the respective connecting shanks 4 and 5 of the connector member 1 and the connecting wires 23 of the electronic component 22, the free ends of the connecting shanks 4 and 5 comprise two opposed cutting blades 4A and 4B that respectively form the Y-shaped slotted notches 13 and 14 therebetween. Thus, as the connecting wires 23 are pressed into the Y-shaped notches 13 and 14, and then further into the slot at the vertex of the Y-shaped notch, the edges of the cutting blades 4A and 4B will cut into and clampingly engage the connecting wires 23, as shown in FIG. 1B.

FIG. 1B further shows a housing 15 made of plastic and configured generally as a bowl that is closed on one side and open on one side. More particularly, the housing 15 has a housing floor forming a mounting surface 18 for receiving the electronic component 22 and the connector member 1 mounted thereon, as well as sidewalls 17, a set-in lid 16, and webs or studs 19. A circuit board 20 that has been previously assembled with electronic components mounted and soldered thereon is arranged in the housing 15 supported on the webs 19. For the sake of clarity, the electronic components, conductor traces and the like provided on the circuit board 20 have been omitted. Copper lined holes 21 are provided through the circuit board 20.

The angled legs of the mounting shanks 2 and 3 of the connector member 1 are inlaid or embedded by means of insert technology into the webs 19 of the plastic housing 15. Similarly, the non-angled base legs of the mounting shanks 2 and 3 and of the connecting shanks 4 and 5 of the connector member 1 are set into the housing floor providing the mounting surface 18. The pyramid-shaped tips 6 and 7 forming the press-in pin ends of the mounting shanks 2 and 3 protrude upwardly out of the webs 19 and are pressed into the copper-lined holes 21 in the circuit board 20. As mentioned above, the connecting wires 23 of a wired electronic component 22 are pressed and clamped into the Y-shaped slotted notches 13 and 14 of the connecting shanks 4 and 5.

In the above manner, a respective cold-welded joint is formed to produce a durable and corrosion-resistant electrical connection between the respective mounting shanks 2 and 3 and the copper-lined holes of the circuit board, as well as between the connecting wires 23 and the connecting shanks 4 and 5. The copper-lined holes 21 in the circuit board 20 are arranged in electrically conducting contact with conductor traces on the circuit board, in any known manner, to provide the desired electrical connection of the electronic component 22, through the connector member 1, and via the copper-lined holes 21 to the appropriate circuit on the circuit board 20.

The clamping arrangement of the connecting wires 23 into the Y-shaped slotted notches 13 and 14 can be carried out either before, during, or after the arrangement and assembly of components on the circuit board 20. To provide an additional mechanical fixing or securing of the wired component 22, the housing 15 may further comprise plastic clamping tabs or jaws 24 connected to or extending from the floor 18 of the housing. The plastic tabs or jaws 24 are so configured and arranged that they grasp around and clampingly receive and hold the component 22, especially so as to hold and press the component 22 with its connecting wires 23 into engagement in the Y-shaped slotted notches 13 and 14.

After the electronic component 22 and the connector member 1 have been assembled in the above described manner, the web or frangible link 11 is cut, removed, or separated so that no electrical connection remains respectively between the two mounting shanks 2 and 3 and respectively between the two connecting shanks 4 and 5. Instead, the mounting shank 2 only remains electrically connected to the connecting shank 4, while the mounting shank 3 only remains electrically connected to the connecting shank 5. In this manner, each mounting shank 2 and 3 provides a separate conduction path to the circuit board 20 through the respective copper-lined holes 21, to achieve the necessary circuit connection to the component 22.

The separation of the frangible link or web 11 is preferably carried out mechanically, and especially advantageously in an automated or mechanized manner after the angled legs of the mounting shanks 2 and 3 have been inlaid or embedded into the webs 19 of the housing 15 and the respective base legs of the mounting shanks 2 and 3 and of the connecting shanks 4 and 5 have been laid into the floor 18 of the housing 15 by means of insert technology. Next, the structural unit comprising the webs 19, the housing floor 18, the connector member 1, and the wired component 22 is press-connected to the circuit board 20, whereby the tips 6 and 7 of the shanks 2 and 3 are pressed into the holes 21 of the circuit board 20 so as to provide the necessary contact between the component 22 and the circuit board 20.

Figure 2A:
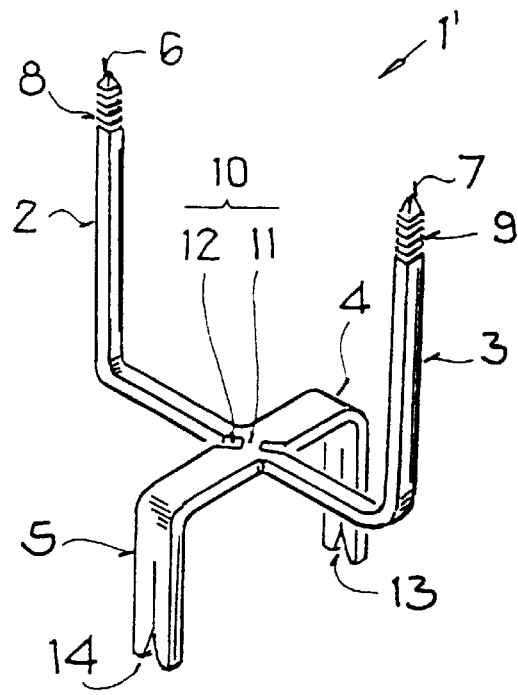
FIG. 2A is a schematic perspective view of a second embodiment of a connector member according to the invention.

FIG. 2A shows a second example embodiment of a connector member 1' that generally corresponds to that shown and described above in connection with FIG. 1A, whereby the identical components bear identical reference numbers. However, in comparison to the connector member 1 shown in FIG. 1A, the present connector member 1' of FIG. 2A has the angled legs of the mounting shanks 2 and 3 extending in an opposite direction relative to the angled legs of the connecting shanks 4 and 5. In other words, the tips 6 and 7 of the mounting shanks 2 and 3 point in a direction substantially 180° opposite that in which the Y-shaped slotted notches 13 and 14 of the connecting shanks 4 and 5 point.

Figure 2B:
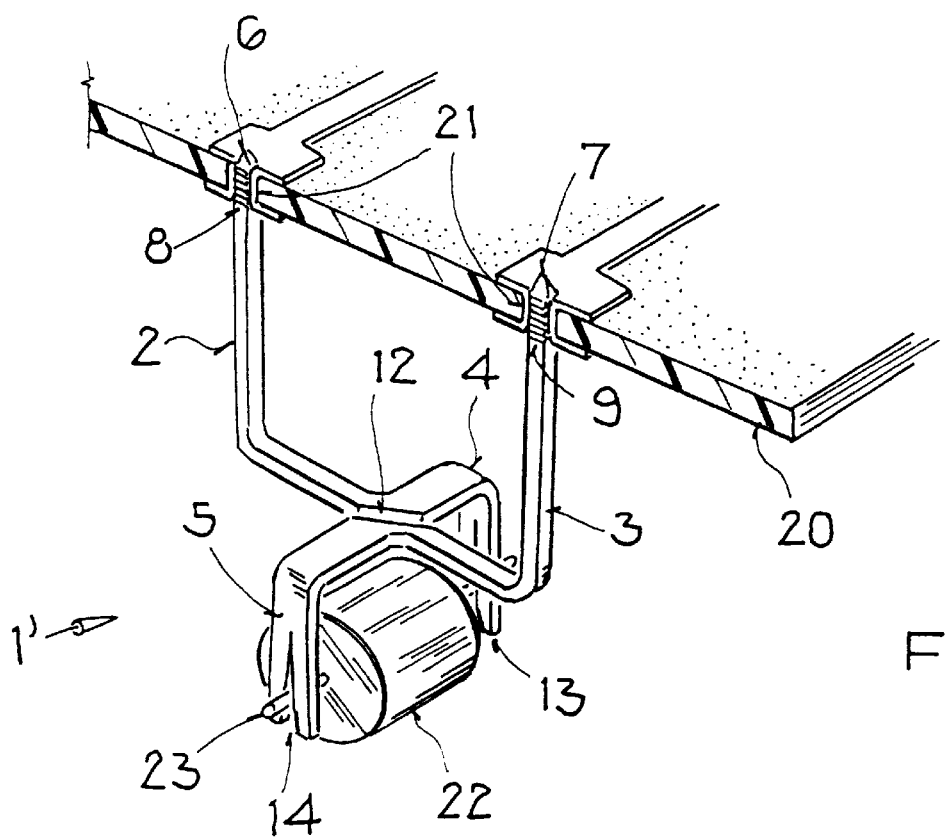
FIG. 2B is a schematic perspective view of the connector member according to FIG. 2A in its installed condition within a housing.

FIG. 2B shows the connector member 1' in an assembled condition connecting a wired electronic component 22 to the circuit board 20. Similarly as described above, the points 6 and 7 of the mounting shanks 2 and 3 of the connector member 1' are embodied as press-in contact pins that are pressed into corresponding copper-lined or copper-coated holes 21 in the circuit board 20, in order to mount and contact the electronic component 22 onto the circuit board 20. The press connection of the mounting shanks 2 and 3 into the holes 21 can be carried out before or after the soldering of the circuit board. The connecting wires 23 of the component 22 are clampingly held in the Y-shaped slotted notches 13 and 14. The above described frangible link or web 11 has been removed, such that the cut or notch 12 extends entirely across the intersection of the base legs of the connector member 1'. Thus, due to the continuous cut 12, there is no longer an electrical connection between the mounting shanks 2 and 3 or between the connecting shanks 4 and 5. Instead, there is only a connection between the mounting shank 2 and the connecting shank 4, as well as a connection between the mounting shank 3 and the connecting shank 5.

This second embodiment of the invention comprising a connector member 1' as shown in FIGS. 2A and 2B is advantageous in all situations when it is not possible to integrate a connector member 1 according to FIGS. 1A and 1B as an insert member or inlaid member into the plastic housing by means of insert technology. Moreover, this embodiment is convenient because a wired electronic component 22 can be mounted or assembled from the same side or the same direction as the other components that are mounted on the circuit board 20. In order to ensure a good mechanical stability as well as a low resistance electrical connection between the connecting wires 23 and the connecting shanks, it is advantageous to make the mounting shanks 2 and 3 as well as the connecting shanks 4 and 5 as short as possible, i. e. only as long as is absolute necessary for the particular application. Moreover, it is further advantageous to provide a plastic clip or clamp holding together the connecting shanks 4 and 5 and/or holding together the mounting shanks 2 and 3, to provide a secure holding arrangement even after the frangible link 11 has been separated as discussed above. FIGS. 3A, 3B, 3C and 3D show a further embodiment for mounting wired electronic components 22 into a housing 15 and electrically contacting these components with a circuit board 20. Once again for securing the electronic component 22, the housing 15 includes plastic tabs or jaws 24 extending from the housing floor 18, and further includes holding pocket members 25 that serve as holders for receiving contact clips 26. These holding pocket members 25 as well as the plastic tabs or jaws 25 are connected to the housing floor 18, for example by means of integral forming, spray-on or injection molding, adhesive bonding, thermal welding, or the like. The contact clip 26, which will be described in detail below, serves to mechanically hold and electrically contact a respective connecting wire 23 of the component 22. To ensure that the component 22 is accurately positioned, stop members 27 are provided on the housing floor 18, preferably in any of the above mentioned manners. A plurality of rod-shaped studs 28 are also formed or connected to extend from the housing 15, whereby the studs 28 will serve to exactly position the height and lateral location of the circuit board 20 to be arranged in the housing 15. More specifically, in order to ensure an accurate height positioning, the studs 28 have a stepped shoulder 29 and a tapering part 30 on the respective free protruding ends thereof.

Electronic components 31 such as surface mount devices (SMDs) are arranged on both surfaces of the circuit board 20, and are interconnected to each other by means of conductor paths or traces 32 to provide the necessary circuit arrangement. Furthermore, the circuit board 20 has holes 33 therein for receiving and being mounted on the studs 28 so as to be held and properly positioned within the housing 15. Contact openings 34 are provided through the circuit board 20 and are conductingly connected to conductor traces 32, such that the contact pins or press-in pins 35 of a contact plug rail 36 arranged in the housing 15 as well as the contact pins or press-in pins 37 of the contact clips 26 can be pressed into and received in the contact openings 34 for providing electrical contact as well as a mechanical connection.

Figure 3A:
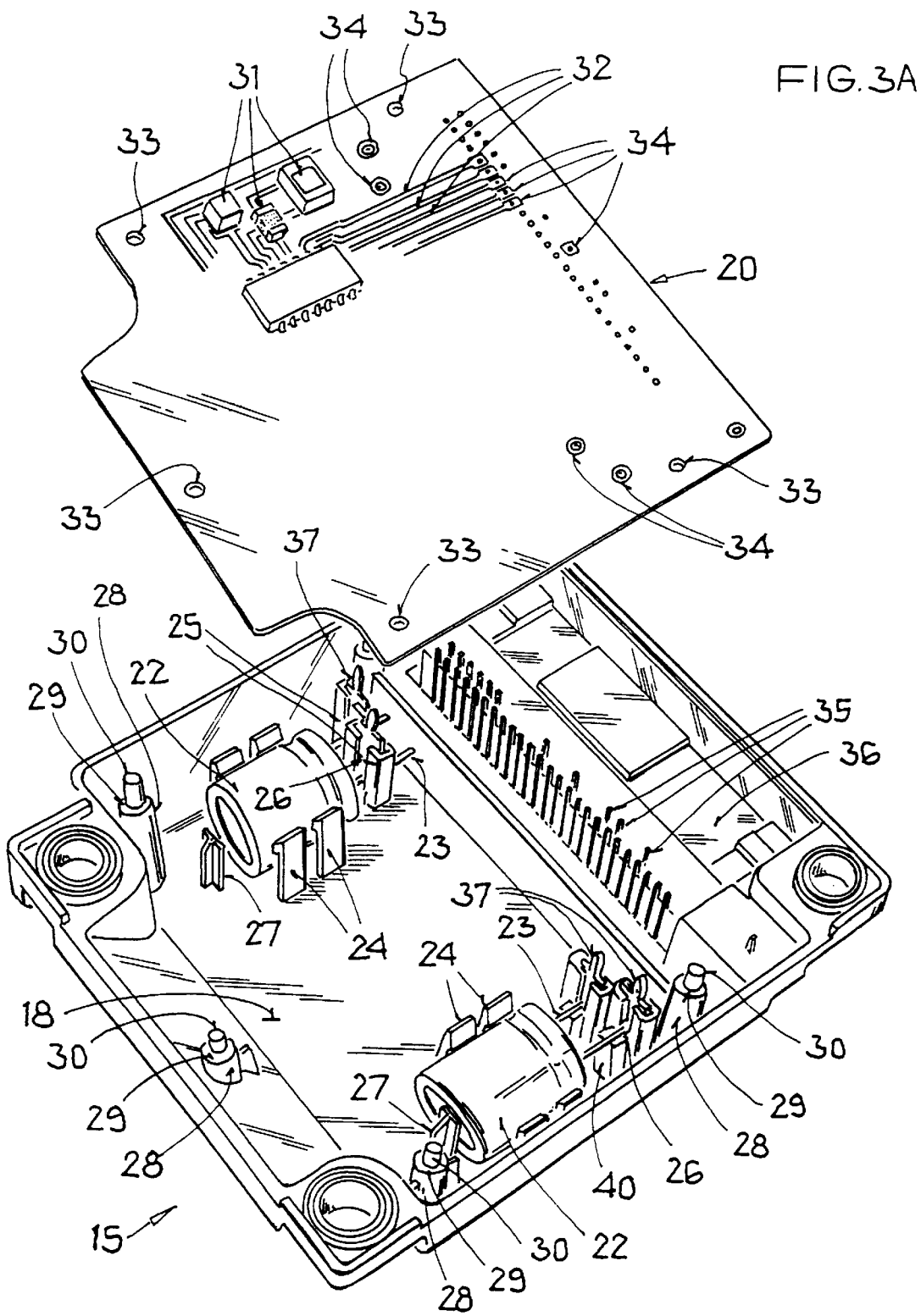
FIG. 3A is a schematic perspective view of a third embodiment of the inventive arrangement in the assembled condition, but with a circuit board removed in an exploded view.
Figure 3B:
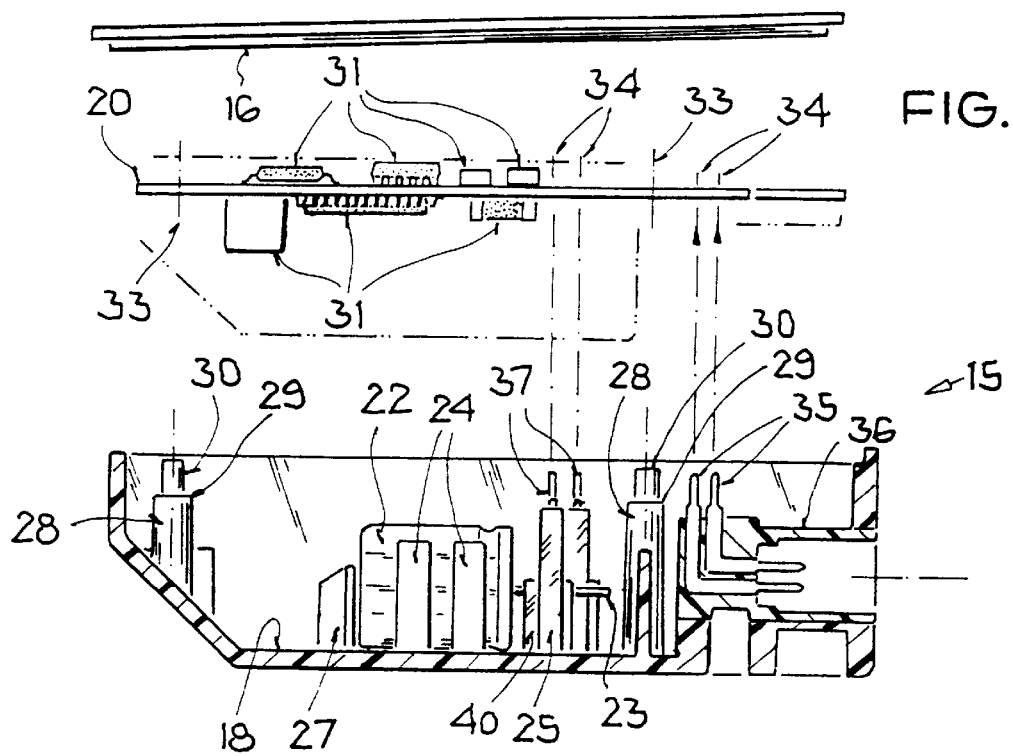
FIG. 3B is a schematic sectional view of the arrangement according to FIG. 3A illustrating the exploded view.

FIG. 3B illustrates the exact positioning of the circuit board 20 with the surface mount device components 31 mounted thereon, within the housing 15. The assembly is preferably carried out by automatically and mechanically setting the electrically assembled circuit board 20 into the housing 15, such that the tapered end parts 30 of the studs 28 are guided into the corresponding holes or recesses 33 in the circuit board 20. Thereby, the contact or press-in pins 35 and 37 are also respectively pressed into the associated contact openings 34 by means of press-in assembly technology, whereby a mechanically and electrically durable and reliable connection providing a low-ohmic electrical contact is achieved. Alternatively, it is possible to electrically contact and mechanically secure the contact pins 35 and 37 that have been plugged into the contact openings 34, in some other manner, for example by means of soldering or any other known connecting technique. Finally, the housing 15 is closed and sealed by assembling the set-in lid 16 thereon.

The illustrated housing and assembly has several important advantages. Since the wired electronic components 22 are not arranged directly on the circuit board 20, but rather are arranged on the housing floor 18 and electrically connected to the circuit board 20 by means of the contact clips 26, the circuit board 20 itself can be assembled with only surface mount device components 31 mounted thereon. For this reason, the circuit board 20 may have a much smaller total surface area size, and it is possible to assemble the circuit board 20 using only a single reflow soldering process, because a mixed or hybrid assembly including both wired components 22 as well as surface mount device components 31 has been avoided. Moreover, it is quite simple to position the circuit board 20 at a sufficient spacing distance above the wired components 22 by proper arrangement and location of the stepped shoulder 29 of each stud 28, so that it is possible to arrange surface mount device components 31 on both the top surface and the bottom surface of the circuit board 20. This provides a further way of reducing or conserving the expensive circuit board surface area.

Figure 3C:
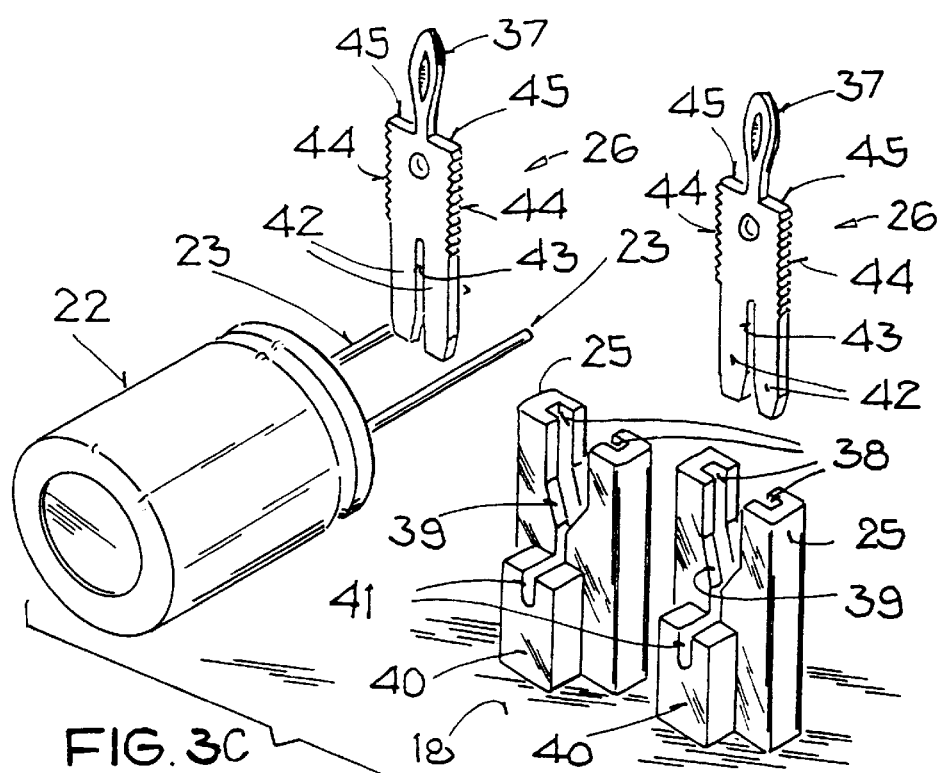
FIG. 3C is a perspective view of the individual components forming the inventive connections according to FIG. 3A, again in a disassembled or exploded condition.

FIG. 3C shows in detail the holding pocket members 25 and the associated contact clips 26 that are used for forming an electrical contact or connection between the wired component 22 and the circuit board 20. The holding pocket members 25 may be either injection molded plastic parts that are individually and separately manufactured and then mechanically mounted on the housing floor 18 by means of gluing, thermal welding, or in any other manner, or integral components simultaneously formed with the plastic housing 15.

Each holding pocket member 25 has a grooved slot therein with two opposed U-shaped guide grooves 38 for guiding and receiving the respective contact clip 26 therein. For this purpose, the lateral width of the U-shaped guide grooves 38 is very slightly greater than the corresponding thickness of the respective contact clip 26. Extending on a plane substantially perpendicular to the plane of the guide grooves 38 and the contact clip 26, each holding pocket member 25 further includes a tapering slot or slit 39 between the two respective U-shaped guide grooves 38, whereby the plan view shape of each tapering slot or slit 39 includes a parallel sided portion that is open toward the top, and that transitions into a tapering portion that tapers in a Y-shape toward the bottom. This tapering slot or slit 39 receives the respective connecting wire 23 therein, and guides the wire 23 downward into a support block 40 having an upward facing open U-shaped slot 41 in the top surface thereof. This support block 40 ultimately receives the connecting wire 23 in the U-shaped slot 41 and thereby positions and supports the respective connecting wire 23 during the contact-forming process.

The contact clips 26 are electrically conducting, for example they are members stamp-cut from a metal sheet material, so as to form electrical connecting means 26. Each contact clip 26 respectively comprises, at its lower end, two opposed and mutually slightly tilted or angled cutting blades 42 separated from one another by a Y-shaped gap 43. The smallest spacing width of the gap 43 is slightly smaller or narrower than the outer diameter or thickness of the conductor of a respective connecting wire 23. Therefore, in the assembled condition, the wire 23 will be slightly cut and clamped between the two cutting blades 42. At its central portion, each contact clip 26 comprises Z-shaped barbs or ridges 44 along its outer edges, whereby the contact clip 26 is securely held in the guide grooves 38 when the contact clip 26 is engaged into the holding pocket member 25. The upper portion of each contact clip 26 is embodied as a contact pin 37, preferably as a slotted or springy press-in pin, such that these contact pins 37 form a mechanically stable and electrically well-conducting connection when inserted into the contact openings 34 as described above.

Each contact clip 26 may further have a shoulder or step 45 at the area of the junction between the upper portion embodied as a contact pin 37 and the central portion having the barbs or ridges 44. The central portion of the contact clip 26 can also be provided with a step or shoulder, in that the central portion with the barbs 44 is dimensioned wider than the bottom portion having the cutting blades 42. This shoulder or step serves as a stop shoulder to guarantee a positive location and dimensional arrangement of the respective contact clip 26 relative to the respective connecting wire 23 when forming the electrical contact therebetween, and also serves to positively locate the contact clip 26 relative to the intended position of the circuit board 20. Furthermore, this step or shoulder will act as a positive counter-support against the associated holding pocket member 25 when pressing the contact pin 37 into the associated contact opening 34 of the circuit board 20, or rather pressing the circuit board 20 against the contact pin 37.

FIG. 3D shows the final assembled configuration of the electrically connected assembly including the wired electronic component 22, and the contact clips 26 pushed into the holding pocket members 25. The assembly process is preferably carried out automatically by corresponding assembly equipment. The process is carried out by first laying the connecting wires 23 into the respective V-shaped or Y-shaped tapering slots 39 of the holding pocket members 25 so that the wires come to rest in the respective U-shaped slots 41 of the support blocks 40. Next, the contact clips 26 are respectively inserted and pushed into the holding pocket members 25, namely such that the contact clips 26 are received in and guided by the U-shaped guide grooves 38. As each contact clip 26 is pushed down, the respective connecting wire 23 is received in the respective gap 43 between the cutting blades 42 of the contact clip 26, whereby the blades 42 cut into the wire 23 and thereby form a gas-tight and corrosion resistant cutting or piercing and clamping connection having a low junction resistance. Meanwhile, the barbs 44 (which are not visible here) become engaged in the guide grooves 38, so as to ensure a durable, mechanically rigid and secure connection, adequate for the vibration resistance and other requirements of motor vehicle manufacturers and the like. If desired, the connection wires 23 can be additionally secured in the holding pocket members 25 by plastically deforming the support blocks 40 by a warm upsetting process so as to partially or completely close the U-shaped slots 41 around the connecting wires 23.

The housing and arrangement of components according to the invention is adapted for providing at least one circuit board in combination with at least one wired electronic component that cannot be manufactured or can only be manufactured with great difficulty as a surface mount device. The contacting and assembly process is embodied to be flexible and adaptable to different situations, and can easily be automated and carried out by machines.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. An electronic assembly comprising:
   a housing having a mounting surface therein;
   a circuit board having a first electronic component arranged thereon and being arranged in said housing displaced from said mounting surface;
   a second electronic component mounted on said mounting surface in said housing; and
   an electrical connector arrangement electrically connecting said second electronic component with said circuit board;
   wherein said second electronic component comprises a wired device and at least one connecting wire extending therefrom, and
   wherein said electrical connector arrangement comprises a contact holding member connected to said mounting surface, and a contact clip that is held by said contact holding member, that electrically contacts said connecting wire, and that electrically contacts said circuit board.

2. The electronic assembly according to claim 1, wherein said circuit board is arranged in said housing so as to be opposite and facing said mounting surface on which said second electronic component is mounted.

3. The electronic assembly according to claim 1, wherein said first electronic component is a surface mount device that is surface-mounted and electrically connected on a first surface of said circuit board.

4. The electronic assembly according to claim 3, wherein said wired device is a wired discrete component selected from the group consisting of capacitors, coils, and reed contact elements.

5. The electronic assembly according to claim 1, wherein said contact clip comprises a cutting and clamping contact that cooperates with said contact holding member to together form a cutting and clamping contact arrangement, wherein said cutting and clamping contact cuts into and clampingly holds said connecting wire.

6. The electronic assembly according to claim 1, wherein said circuit board has a contact hole therein, and wherein said contact clip comprises a press-in contact pin engagingly press-fitted into said contact hole.

7. An electronic assembly comprising:
   a housing having a mounting surface therein;
   a circuit board having a first electronic component arranged thereon and being arranged in said housing displaced from said mounting surface;
   a second electronic component mounted on said mounting surface in said housing;
   an electrical connector arrangement electrically connecting said second electronic component with said circuit board; and
   mounting tabs extending from said mounting surface and holding said second electronic component.

8. The electronic assembly according to claim 1, wherein said housing has a bowl-shaped configuration including a housing floor and housing walls, and wherein said mounting surface is an interior surface of said housing floor.

9. An electronic assembly comprising:
   a housing having a mounting surface therein;
   a circuit board having a first electronic component arranged thereon and being arranged in said housing displaced from said mounting surface;
   a second electronic component mounted on said mounting surface in said housing; and
   an electrical connector arrangement electrically connecting said second electronic component with said circuit board;
   wherein said second electronic component comprises a wired device and first and second connecting wires extending therefrom, and
   wherein said electrical connector arrangement comprises:
      a first electrically conducting angled element that includes a first angled mounting shank and a first angled connecting shank, wherein said first angled mounting shank has a first press-in contact pin at a free end thereof mechanically and electrically connected to said circuit board, and wherein said first angled connecting shank is connected to said first angled mounting shank and is electrically connected to said first connecting wire,
      a second electrically conducting angled element including a second angled mounting shank and a second angled connecting shank, wherein said second angled mounting shank has a second press-in contact pin at a free end thereof mechanically and electrically connected to said circuit board, and wherein said second angled connecting shank is connected to said second angled mounting shank and is electrically connected to said second connecting wire, and
      a frangible link member that separatably connects said first and second angled elements to each other in an original interconnected condition.

10. The electronic assembly according to claim 9,
   wherein said first and second angled mounting shanks respectively comprise first and second mounting shank base legs and first and second mounting shank angled legs respectively extending at an angle from said mounting shank base legs,
   wherein said first and second angled connecting shanks respectively comprise first and second connecting shank base legs and first and second connecting shank angled legs respectively extending at an angle from said connecting shank base legs,
   wherein said first and second mounting shank base legs extend along a first lengthwise axis and said first and second connecting shank base legs extend along a second lengthwise axis, and
   wherein said first and second lengthwise axes intersect each other at a right angle.

11. The electronic assembly according to claim 9,
   wherein said first and second angled mounting shanks respectively comprise first and second mounting shank base legs and first and second mounting shank angled legs respectively extending at a 90° angle from said mounting shank base legs, and
   wherein said first and second angled connecting shanks respectively comprise first and second connecting shank base legs and first and second connecting shank angled legs respectively extending at a 90° angle from said connecting shank base legs.

12. The electronic assembly according to claim 9,
   wherein said first and second angled mounting shanks respectively comprise first and second mounting shank base legs and first and second mounting shank angled legs respectively extending in a first direction at an angle from said mounting shank base legs, wherein said first and second angled connecting shanks respectively comprise first and second connecting shank base legs and first and second connecting shank angled legs respectively extending in a second direction at an angle from said connecting shank base legs, and wherein said first direction is the same direction as said second direction.

13. The electronic assembly according to claim 9, wherein said first and second angled mounting shanks respectively comprise first and second mounting shank base legs and first and second mounting shank angled legs respectively extending in a first direction at an angle from said mounting shank base legs, wherein said first and second angled connecting shanks respectively comprise first and second connecting shank base legs and first and second connecting shank angled legs respectively extending in a second direction at an angle from said connecting shank base legs, and wherein said first direction and said second direction are relatively opposite directions.

14. The electronic assembly according to claim 9, wherein said first and second connecting shanks respectively comprise first and second receiving contacts at free ends thereof respectively receiving and electrically contacting said first and second connecting wires.

15. The electronic assembly according to claim 14, wherein said first and second receiving contacts respectively comprise first and second Y-shaped slotted notches in said free ends of said connecting shanks, and said first and second connecting wires are respectively received in said first and second Y-shaped slotted notches to form respective cutting and clamping connections between said receiving contacts and said connecting wires.

16. The electronic assembly according to claim 9, wherein said mounting shanks are respectively longer than said connecting shanks.

17. The electronic assembly according to claim 9, wherein said frangible link member comprises a web interconnecting said first and second angled elements, and wherein said web is located between and interrupts the continuity of two elongated cut-out notches between said first and second angled elements.

18. The electronic assembly according to claim 9, wherein said electrical connector arrangement consists of an alloy selected from the group consisting of copper-beryllium alloys and metal alloys other than copper-beryllium alloys having mechanical and electrical properties similar to copper-beryllium alloys.

19. The electronic assembly according to claim 18, wherein said electrical connector arrangement is an integral one-piece member of said alloy.

20. An electronic assembly comprising:

a housing having a mounting surface therein;

a circuit board having a first electronic component arranged thereon and being arranged in said housing displaced from said mounting surface;

a second electronic component mounted on said mounting surface in said housing; and an electrical connector arrangement electrically connecting said second electronic component with said circuit board;

wherein said housing is a plastic housing.

21. A method of assembling the electronic assembly according to claim 9, wherein said first and second connecting shanks respectively comprise first and second wire clamping contacts at free ends thereof, and wherein said circuit board has first and second contact holes therein, said method comprising the following steps in order:

a) clamping said first and second connecting wires respectively into said first and second wire clamping contacts;

b) after said step a), pressing said first and second press-in contact pins of said first and second mounting shanks respectively into said first and second contact holes in said circuit board; and c) after said step b), separating or removing said frangible link member so as to separate said first mounting shank and first connecting shank from said second mounting shank and second connecting shank.

22. A method of assembling the electronic assembly according to claim 9, wherein said first and second mounting shanks respectively comprise first and second mounting shank base legs and first and second mounting shank angled legs respectively extending at an angle from said mounting shank base legs, wherein said first and second connecting shanks respectively comprise first and second connecting shank base legs and first and second connecting shank angled legs respectively extending at an angle from said connecting shank base legs and respectively having first and second wire clamping contacts at free ends thereof, wherein said circuit board has first and second contact holes therein, and wherein said housing comprises a housing floor and studs protruding inwardly from said floor, said method comprising the following steps in order:

a) embedding said mounting shank angled legs in said studs of said housing, and embedding said mounting shank base legs and said connecting shank base legs in said housing floor, by an insert technology process;

b) after said step a), separating or removing said frangible link member so as to separate said first mounting shank and first connecting shank from said second mounting shank and second connecting shank;

c) after said step b), clamping said first and second connecting wires respectively into said first and second wire clamping contacts; and d) after said step c), pressing said first and second press-in contact pins of said first and second mounting shanks respectively into said first and second contact holes in said circuit board, so as to establish an electrical connection between said second electronic component and said circuit board.

23. A method of assembling the electronic assembly according to claim 9, wherein said first and second connecting shanks respectively comprise first and second wire clamping contacts at free ends thereof, and wherein said circuit board has first and second contact holes therein, said method comprising the following steps in order:

a) pressing said first and second press-in contact pins of said first and second mounting shanks respectively into said first and second contact holes in said circuit board;

b) after said step a), separating or removing said frangible link member so as to separate said first mounting shank and first connecting shank from said second mounting shank and second connecting shank; and c) after said step b), clamping said first and second connecting wires respectively into said first and second wire clamping contacts.

* * * * *

UNITED STATES PATENT AND TRADEMARK OFFICE
CERTIFICATE OF CORRECTION

PATENT NO. : 6,163,460
DATED : December 19, 2000
INVENTOR(S) : Baur et al.

It is certified that error appears in the above-identified patent and that said Letters Patent is hereby corrected as shown below:

Title page,
Item [73], Assignee, line 2, after "GmbH," replace "heilbrohn" by -- Heilbronn --;

Signed and Sealed this

Twentieth Day of November, 2001

Attest:

*Nicholas P. Godici*

NICHOLAS P. GODICI
*Attesting Officer*        *Acting Director of the United States Patent and Trademark Office*

UNITED STATES PATENT AND TRADEMARK OFFICE
CERTIFICATE OF CORRECTION

PATENT NO.   : 6,163,460
DATED        : December 19, 2000
INVENTOR(S)  : Baur et al.

It is certified that error appears in the above-identified patent and that said Letters Patent is hereby corrected as shown below:

Title page,
Item [56] Under "References Cited"U.S. PATENT DOCUMENTS, delete line 2;
Item [56] Under "References Cited" FOREIGN PATENT DOCUMENTS, delete lines 1 to 5; delete lines 7 to 14;
Item [56] Under "References Cited" please delete heading "OTHER PUBLICATIONS" and lines 1 to 8.

Signed and Sealed this

Fourth Day of December, 2001

Attest:

NICHOLAS P. GODICI
Attesting Officer    Acting Director of the United States Patent and Trademark Office